United States Patent
Hosseini et al.

(10) Patent No.: US 9,070,568 B2
(45) Date of Patent: Jun. 30, 2015

(54) CHIP PACKAGE WITH EMBEDDED PASSIVE COMPONENT

(71) Applicant: Infineon Technologies AG, Neubiberg (DE)

(72) Inventors: Khalil Hosseini, Weihmichl (DE); Joachim Mahler, Regensburg (DE); Georg Meyer-Berg, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/951,556

(22) Filed: Jul. 26, 2013

(65) Prior Publication Data
US 2015/0028448 A1    Jan. 29, 2015

(51) Int. Cl.
*H01L 23/34* (2006.01)
*H01L 25/065* (2006.01)
*H01L 23/12* (2006.01)
*H01L 23/00* (2006.01)
*H01L 49/02* (2006.01)

(52) U.S. Cl.
CPC ............ *H01L 25/0657* (2013.01); *H01L 23/12* (2013.01); *H01L 24/85* (2013.01); *H01L 28/00* (2013.01); *H01L 2224/85* (2013.01); *H01L 2225/0651* (2013.01); *H01L 2225/06572* (2013.01); *H01L 2225/06582* (2013.01)

(58) Field of Classification Search
CPC ..... H01L 23/12; H01L 24/85; H01L 25/0657; H01L 28/00; H01L 2224/85; H01L 2225/0651; H01L 2225/06572; H01L 2225/06582

USPC ............ 257/724, E23.116, E23.124, E23.125
See application file for complete search history.

(56) References Cited

U.S. PATENT DOCUMENTS

| | | | | |
|---|---|---|---|---|
| 5,608,261 | A * | 3/1997 | Bhattacharyya et al. | 257/700 |
| 5,668,406 | A * | 9/1997 | Egawa | 257/690 |
| 5,757,072 | A * | 5/1998 | Gorowitz et al. | 257/700 |
| 6,333,856 | B1 * | 12/2001 | Harju | 361/761 |
| 7,045,440 | B2 * | 5/2006 | Huff et al. | 438/456 |
| 7,196,898 | B2 * | 3/2007 | Osaka et al. | 361/321.1 |
| 7,312,518 | B2 * | 12/2007 | Liao et al. | 257/686 |
| 7,319,049 | B2 * | 1/2008 | Oi et al. | 438/106 |
| 7,385,296 | B2 * | 6/2008 | Ohta | 257/784 |
| 7,446,262 | B2 * | 11/2008 | Ogawa et al. | 174/255 |
| 7,488,897 | B2 * | 2/2009 | Ogawa et al. | 174/260 |
| 7,750,247 | B2 * | 7/2010 | Chikagawa et al. | 174/260 |
| 7,929,316 | B2 * | 4/2011 | Noda et al. | 361/795 |
| 8,068,347 | B2 * | 11/2011 | Choi et al. | 361/766 |
| 8,164,171 | B2 * | 4/2012 | Lin et al. | 257/686 |

(Continued)

FOREIGN PATENT DOCUMENTS

JP    11026279 A    1/1999

OTHER PUBLICATIONS

Ewe, H., et al. "Chip Package and Method for Manufacturing the Same." U.S. Appl. No. 13/803,108, filed Mar. 14, 2013.

*Primary Examiner* — Ida M Soward
(74) *Attorney, Agent, or Firm* — Murphy, Bilak & Homiller, PLLC

(57) ABSTRACT

A chip package includes an electrically conducting chip carrier and at least one first semiconductor chip attached to the electrically conducting chip carrier. The chip package further includes a passive component. The electrically conducting chip carrier, the at least one first semiconductor chip, and the passive component are embedded in an insulating laminate structure.

19 Claims, 10 Drawing Sheets

(56) References Cited

U.S. PATENT DOCUMENTS

| | | | |
|---|---|---|---|
| 8,187,920 B2 * | 5/2012 | Mohan et al. | 438/106 |
| 8,455,300 B2 * | 6/2013 | Chi et al. | 438/109 |
| 8,742,579 B2 * | 6/2014 | Pagaila et al. | 257/741 |
| 8,754,514 B2 * | 6/2014 | Yu et al. | 257/686 |
| 8,822,266 B2 * | 9/2014 | Smeys et al. | 438/106 |
| 2005/0230848 A1 * | 10/2005 | Nakatani et al. | 257/783 |
| 2006/0038289 A1 | 2/2006 | Hsu et al. | |
| 2006/0157832 A1 * | 7/2006 | Ryu et al. | 257/678 |
| 2006/0191711 A1 * | 8/2006 | Cho et al. | 174/260 |
| 2007/0025092 A1 * | 2/2007 | Lee et al. | 361/761 |
| 2009/0072388 A1 | 3/2009 | Tews et al. | |
| 2009/0115047 A1 * | 5/2009 | Haba et al. | 257/690 |
| 2009/0236647 A1 | 9/2009 | Barth et al. | |
| 2010/0127386 A1 | 5/2010 | Meyer-Berg | |
| 2011/0108971 A1 | 5/2011 | Ewe et al. | |
| 2011/0127675 A1 * | 6/2011 | Ewe et al. | 257/773 |
| 2013/0010446 A1 | 1/2013 | Henrik et al. | |

* cited by examiner

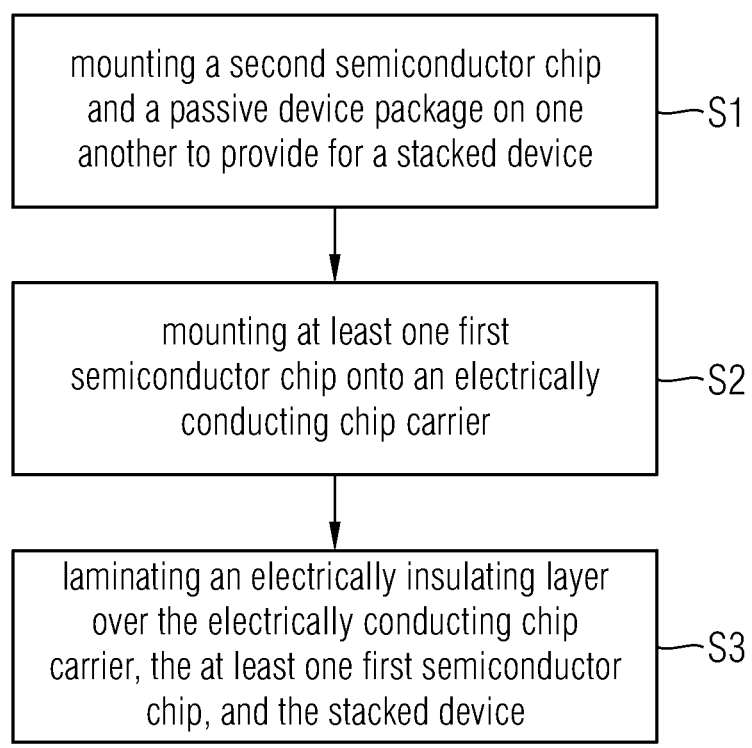

CHIP PACKAGE WITH EMBEDDED PASSIVE COMPONENT

TECHNICAL FIELD

The invention relates to the technique of semiconductor chip packaging, and more particularly to semiconductor chip packages with embedded passive components.

BACKGROUND

The necessity to provide smaller, thinner, lighter, cheaper electronic systems with reduced power consumption, more diverse functionality and improved reliability has driven a stream of technological innovations in all technical fields involved. This is also true for the areas of assembly and packaging providing protective environment for miniaturized electronic systems and allowing for a high degree of reliability.

SUMMARY

According to an embodiment of a chip package, the chip package comprises an electrically conducting chip carrier, at least one first semiconductor chip attached to the electrically conducting chip carrier, a passive component, and an insulating laminate structure embedding the electrically conducting chip carrier, the at least one first semiconductor chip, and the passive component.

According to another embodiment of a chip package, the chip package comprises a passive component, a metal layer covering at least partially at least one main surface of the passive component, at least one first semiconductor chip attached to the metal layer, and an insulating laminate structure embedding the passive component and the at least one first semiconductor chip.

According to an embodiment of a method of fabricating a chip package, the comprises: mounting a second semiconductor chip and a passive component on one another to provide for a stacked device; mounting at least one first semiconductor chip onto an electrically conducting chip carrier; and laminating an electrically insulating layer over the electrically conducting chip carrier, the at least one first semiconductor chip, and the stacked device.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Reference numerals in different figures which only differ in the leading digit may refer to similar or identical parts except where the context indicates otherwise. Reference numerals to which a suffix "_n" is added refer to a particular element of the referenced part.

FIG. 10 illustrates a flow chart of a method of manufacturing a chip package with a stack of a passive component and a semiconductor chip.

DETAILED DESCRIPTION OF THE EMBODIMENTS

Figure 1A:
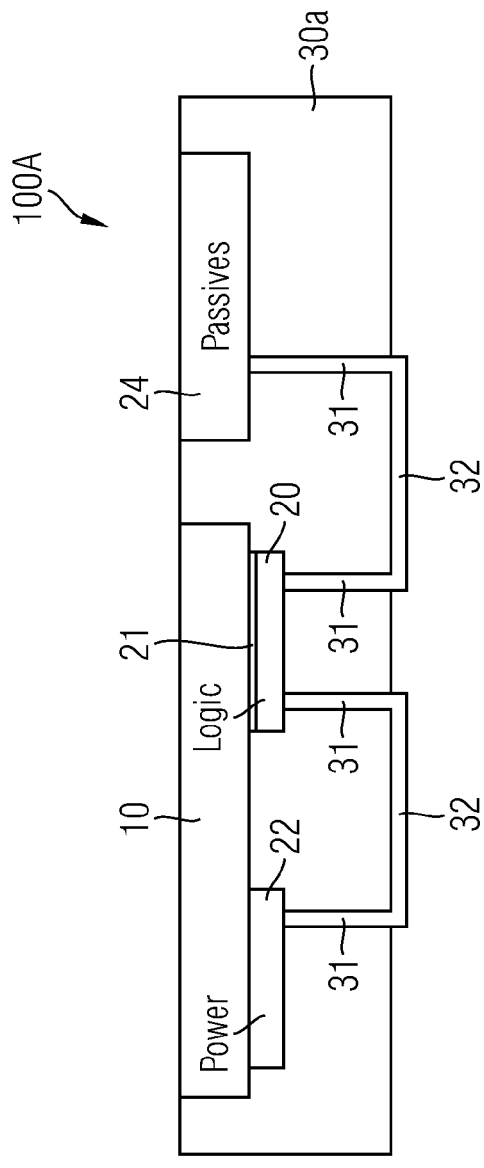
FIG. 1A schematically illustrates a cross-sectional view of one embodiment of a chip package comprising a chip carrier, a logic chip, a power chip, a passive component, and an insulating laminate structure.

Aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof and which show by way of illustration specific embodiments in which the invention may be practiced. It may be evident, however, to one skilled in the art that one or more aspects of the embodiments may be practiced with a lesser degree of the specific details.

Directional terminology, such as "top", "bottom", "left", "right", "upper", "lower", "front", "back", "leading" etc., is used with reference to the orientation of the figures(s) described herein. Because embodiments can be positioned in different orientations, the directional terminology is used only for purposes of illustration and is in no way limiting. Further, it is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

The semiconductor chip(s) described further below may be of different types, may be manufactured by different technologies and may include, for example, integrated electrical, electro-optical or electro-mechanical circuits and/or passives. The semiconductor chip(s) may, for example, be configured as power chip(s), such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chip(s) may include control circuits, microprocessors or microelectromechanical components. The semiconductor chip(s) need not be manufactured from specific semiconductor material, for example Si, SiC, SiGe, GaAs, and, furthermore, may contain inorganic and/or organic materials that are not semiconductors, such as insulators, plastics, or metals.

In particular, semiconductor chip(s) having a vertical structure may be involved, that is to say that the semiconductor chip(s) may be fabricated in such a way that electrical currents flows in a direction perpendicular to the main surfaces of the semiconductor chip(s). A semiconductor chip having a vertical structure may have contact pads in particular on its two main surfaces, that is to say on its bottom side and top side. In particular, power chip(s), i.e. power semiconductor chip(s), may have a vertical structure. By way of example, the source electrode and gate electrode of a power chip, e.g. a power MOSFET chip, may be situated on one main surface, while the drain electrode of the power chip is arranged on the other main surface.

Furthermore, the chip packages described herein may include logic integrated circuit chip(s) (logic chip(s)), which may control other semiconductor chip(s) of the chip package. For example, the gate electrode of a power chip may be controlled by an electrical trace from a logic chip. In one embodiment the logic chip(s) may have a non-vertical structure comprising an active main surface with chip contact electrodes and a passive main surface with no chip contact electrodes.

The semiconductor chip(s) may have contact pads (or electrodes) which allow electrical contact to be made with the integrated circuits included in the semiconductor chip(s). The electrodes may be arranged all at only one main surface of a semiconductor chip or at both main surfaces of the semiconductor chip. They may include one or more electrode metal layers which are applied to the semiconductor material of a semiconductor chip. The electrode metal layers may be manufactured with any desired geometric shape and any desired material composition. For example, they may comprise or be made of a material selected from the group of Cu, Ni, NiSn, Au, Ag, Pt, Pd, an alloy of one or more of these metals, an electrically conducting organic material, or an electrically conducting semiconductor material.

One or more semiconductor chips may be mounted on a chip carrier and embedded in an insulating laminate structure. The insulating laminate structure may comprise at least one electrically insulating layer. The at least one electrically insulating layer may have the shape of a foil or a sheet, which is laminated on top of the semiconductor chip(s) and the carrier, or which is laminated onto another electrically insulating layer. The electrically insulating layer may be made of a polymer material. In one embodiment, the electrically insulating layer may be made of a polymer material which is coated with a metal layer, e.g. a copper layer (so-called RCC (Resin Coated Copper) foil). Heat and pressure may be applied for a time suitable to attach the electrically insulating layer to the underlying structure. During lamination, the electrically insulating foil or sheet is capable of flowing (i.e. is in a plastic state), resulting in that gaps between the semiconductor chip(s) or other topological structures on the chip carrier or on other parts of, e.g., a leadframe of which the chip carrier may form a part of are filled with the polymer material of the electrically insulating foil or sheet.

The electrically insulating layer may be made of any appropriate duroplastic, thermoplastic or thermosetting material or laminate. In one embodiment, the electrically insulating layer may be made of a prepreg (short for preimpregnated fibers), that is made, e.g., of a combination of a fiber mat, for example glass or carbon fibers, and a resin, for example a duroplastic material. The duroplastic resin may, e.g., be made on the basis of an epoxy resin. Prepreg materials are known in the art and are typically used to manufacture PCBs (printed circuit boards). In another example, the electrically insulating layer may be made of a particle reinforced laminate resin layer. The particles may be made of the same materials as the fibers of a prepreg layer. In one example, the electrically insulating layer may be made of an unfilled laminate resin layer. As mentioned above, the resin may e.g. be a thermosetting resin. In still another example, the electrically insulating layer may be made of a thermoplastic material, which melts by application of pressure and heat during lamination and (reversibly) hardens upon cooling and pressure release. Laminate resin layers made of a thermoplastic material may also be unfilled, fiber reinforced or particle reinforced. The thermoplastic material may e.g. be one or more materials of the group of polyetherimide (PEI), polyether-sulfone (PES) polyphenylene-sulfide (PPS) or polyamide-imide (PAI).

The insulating laminate structure may comprise at least one electrically conducting layer being applied to a surface of an electrically insulating layer of the insulating laminate structure in order to provide electrical traces or pads for electrical redistribution between components of the chip package. The electrically conducting layer may be, e.g., a metal layer. The electrically conducting layer may be applied to the electrically insulating layer by using deposition processes, such as chemical vapor deposition, physical vapor deposition, chemical and electrochemical techniques, e.g., sputtering, galvanic plating or electroless plating. In other embodiments, the electrically conducting layer, e.g. an electrically conducting foil, may be applied as a whole, e.g. by using a laminating technique. It should be appreciated that any such terms as "applied" or "deposited" are meant to cover literally all kinds and techniques of applying layers onto each other.

The electrically conducting layer may be structured to provide electrical traces or pads for electrical redistribution purposes. By way of example, a structured electrical conducting layer of the insulating laminate structure may define a redistribution layer. Various techniques for generating a structured electrically conducting layer may be used. By way of example, the structured electrically conducting layer may be generated by (partial) etching. Depending on the electrically conducting material different etchants may be used, among them, e.g., copper chloride, iron chloride, HF, NaOH, $HNO_3$, $K_3Fe(CN)_6$ and KI. Etching may be accomplished by using a mask for masking the regions of the electrically conducting layer which are not to be etched. The mask may be an applied structured organic mask layer on the electrically conducting layer. The structured organic mask layer may be applied by printing techniques, such as stencil printing, screen printing or ink jet printing. In another examples, a continuous layer of an organic material, e.g., a photoresist may be applied to the electrically conducting layer and subsequently structured, e.g., by photolithography to produce the structured organic mask layer. For instance, spin coating may be used to apply the continuous layer of organic material. In other examples, the structured electrically conducting layer may be generated by material machining techniques such as e.g. milling or stamping.

The insulating laminate structure may further comprise through-connections in order to provide electrical coupling through an electrically insulating layer of the insulating laminate structure. By way of example the through-connections may couple electrically conducting elements of the chip package such as, e.g., the chip carrier, a contact pad of the semiconductor chip(s) or a structured electrically conducting layer of the insulating laminate structure. The through-connections may be vias (vertical interconnection accesses). A through-connection or via may consist of an opening and an electrically conducting material filling the opening. The opening may pass vertically through the at least one electrically insulating layer in a way that a section of the other electrically conducting element is laid open. The opening may be generated, for example, by conventional drilling, laser drilling, chemical etching, or any appropriate method. Filling of the opening with an electrically conducting material may be performed, e.g., by chemical vapor deposition, physical vapor deposition, chemical and electrochemical techniques, or any other appropriate technique.

The electrically conducting chip carrier on which the semiconductor chip(s) are mounted forms a part of the chip package. By way of example, the electrically conducting chip carrier may form a part of a leadframe. The semiconductor chip(s) may be mounted on this part of the leadframe. The electrically insulating layer of the insulating laminate structure may be laminated onto the leadframe and the semiconductor chip(s) mounted thereon to buildup a laminate structure which covers and embeds the semiconductor chip(s).

By way of example, the electrically conducting chip carrier may, e.g., be a PCB (printed circuit board). The PCB may have at least one PCB insulating layer and a structured PCB metal foil layer attached to the insulating layer. The PCB insulating layer is typically made on the basis of epoxy resin, polythetrafluoroethylene, aramid fibers or carbon fibers and may include reinforcement means such as fiber mats, for example glass or carbon fibers. The semiconductor chip(s) are mounted on the structured PCB metal foil layer. Thus, after lamination of the electrically insulating layer, the chip package may virtually be a multi-layer PCB with one or more bare chips integrated therein.

By way of example, the electrically conducting chip carrier may comprise a plate of ceramics or a plate of ceramics coated with a metal layer. For instance, such carrier may be a DCB (direct copper bonded) ceramics substrate.

The semiconductor chip(s) are bonded onto the electrically conducting chip carrier via a bond layer. In one embodiment, the bond layer is made of solder, e.g. soft solder, hard solder or diffusion solder. If diffusion soldering is used as a connecting technique, solder materials are used which lead to intermetallic phases after the end of the soldering operation at the interfaces between the electrode pads of the semiconductor chip(s), the diffusion solder bond layer and the chip carrier on account of interface diffusion processes. By way of example, solder materials such as, e.g., AuSn, AgSn, CuSn, AgIn, AuIn, CuIn, AuSi, Sn, or Au may be used.

Further, the semiconductor chip(s) may be bonded to the chip carrier by using an electrically conductive adhesive which may be based on epoxy resins or other polymer materials and be enriched with e.g. gold, silver, nickel or copper particles in order to provide for the electrical conductivity. It is also possible to prepare such a layer containing electrically interconnecting particles by either applying so-called nano pastes or by directly depositing metal particles and by performing then a sintering process to produce a sintered metal particle layer.

In one embodiment a passive component may be embedded into the insulating laminate structure of a chip package. The passive component may comprise at least one passive electronic device, such as a resistor, a capacitor, or an inductor. The passive component may comprise integrated passive device(s) such as an IPD (Integrated Passive Device) chip. The IPD chip may be fabricated by standard wafer fabrication technologies such as thin film and photolithography technologies. The substrate used for an IPD chip may be a substrate like silicon, aluminum oxide or glass. Another fabrication technology for IPD chips may be 3D passive integration in, e.g., silicon. The passive component may, optionally, be a bare IPD chip. In other embodiments, the passive component including at least one passive device (e.g. an IPD chip) may have a housing formed by laminating or moulding techniques. The housing may comprise electrical traces coupling the at least one passive electronic device of the passive component to contact pads on the surface of the passive component. The contact pads of the passive component (or passive device package) may be similar as described for the semiconductor chips. By way of example, a passive component embedded into the insulating laminate structure of a chip package with embedded semiconductor chip(s) such as power chip(s) and/or logic chip(s) may provide various advantages such as, for example, a high density of integrated devices, a high functionality of the chip package and a relative simple 3D packaging of electronic devices in the chip package.

FIG. 1A schematically illustrates a cross-sectional view of a chip package 100A. The chip package 100A includes an electrically conducting chip carrier 10. As mentioned above, the chip carrier 10 may be a flat metal plate. The material of the metal plate may be copper, aluminum or any other suitable material. Byway of example the chip carrier 10 may be a leadframe or a part thereof. In another implementation, the chip carrier 10 may comprise or be made of plastic or a ceramic material being coated with an electrically conducting layer such as, e.g., a metal foil.

At least one logic chip 20 and/or at least one power chip 22 may be mounted onto the electrically conducting chip carrier 10. The semiconductor chip 20 and e.g. the (optional) semiconductor chip 22 may be mounted onto the bottom side of the chip carrier 10. In another implementation, the semiconductor chips 20 and 22 may be mounted onto the topside of the chip carrier 10, or the semiconductor chips 20 and 22 may be mounted onto different sides of the chip carrier 10. The logic chip 20 may have a non-vertical structure with a passive surface and an active surface opposite to the passive surface. The passive surface of the logic chip 20 may face towards the electrically conducting chip carrier 10 and may be attached to the electrically conducting chip carrier 10 by an electrically insulating layer 21. The active surface of the logic chip 20 may have contact pads (not shown) electrically coupled to the integrated circuits of the logic chip 20.

In the implementation shown in FIG. 1A, the active surface of the logic chip 20 may have at least two contact pads. A first contact pad of the logic chip 20 may, e.g., be coupled to the power chip 22 in order to control e.g. the gate electrode (not shown) of the power chip 22. The power chip 22 may have a vertical structure. In one implementation, the drain electrode may be on one main surface of the power chip 22 and the source and gate electrodes may be on the other main surface of the power chip 22. As shown by way of example in FIG. 1, the drain electrode of the power chip 22 may be attached to the electrically conducting chip carrier 10. The gate electrode (not shown) being opposite to the drain electrode may be coupled to the logic chip 20, as mentioned above. The source electrode (not shown) of the power chip 22 may be connected to any appropriate electrical connection, e.g. to a power source terminal pad of the chip package 100A.

The chip package 100A may further comprise a passive component 24. The passive component 24 may comprise at least one passive device, such as a capacitor, a resistor, an inductor, or an IPD chip implementing one or more of the aforementioned passive devices. The passive component 24 may further comprise a housing made e.g. by laminating or moulding techniques. The passive component 24 may have contact pads (not shown) on one main surface, or on both main surfaces. The contact pads (not shown) of the passive component 24 may electrically be coupled to the at least one passive device of the passive component 24. The top side of the passive component 24 may have at least one contact pad coupled to the at least one passive device of the passive component 24. In another implementation, the passive component 24 may have no contact pads arranged on its top side surface. As shown in FIG. 1A, the bottom side of the passive component 24 may e.g. be equipped with at least one contact pad (not shown) which is connected to an electrical trace or through-connection 31 coupling the passive component 24 and the logic chip 20.

The chip package 100A may further comprise an insulating laminate structure 30 embedding the electrically conducting chip carrier 10, the logic chip 20, the power chip 22 and the passive component 24. The insulating laminate structure 30 may comprise at least one electrically insulating layer. In one embodiment, as e.g. shown in FIG. 1A, the at least one electrically insulating layer of the insulating laminate structure 30 may be represented by a first electrically insulating layer 30a. The first electrically insulating layer 30a may be laminated onto the bottom side of the chip carrier 10 with the semiconductor chips 20 and 22 mounted thereon and onto the bottom side of the passive component 24. The first electrically insulating layer 30a may partly or completely cover one or all side walls and a main surface of the passive component 24. It may further partly or completely cover the semiconductor chip 20 and (optional) semiconductor chip 22 facing away from the chip carrier 10, and may partly or completely cover the bottom side of the chip carrier 10 at zones which are not covered by the semiconductor chips 20 and 22. A top side of the chip carrier 10 and of the passive component 24 may, e.g., remain uncovered by the first electrically insulating layer 30a.

The insulating laminate structure 30 may further include through-connections or vias 31 providing at least one electrical connection running vertically through at least one electrically insulating layer of the insulating laminate structure 30, e.g. through the first electrically insulating layer 30a as illustrated in FIG. 1A. Further, the through-connections 31 may extend from a contact pad (not shown) of the power chip 22, the logic chip 20 or the passive component 24 to the bottom side of the first electrically insulating layer 30a of the insulating laminate structure 30.

The insulating laminate structure 30 may further include at least one structured electrically conducting layer. A first structured electrically conducting layer 32 may be applied at the bottom side of the insulating laminate structure 30, e.g., at the bottom side of the electrically insulating layer 30a as illustrated in FIG. 1A. The first structured electrically conducting layer 32 may comprise electrical traces or pads for electrical redistribution. By way of example, the first structured electrically conducting layer 32 may comprise one section coupling the power chip 22 with the logic chip 20 and another section coupling the logic chip 20 with the passive component 24.

Figure 1B:
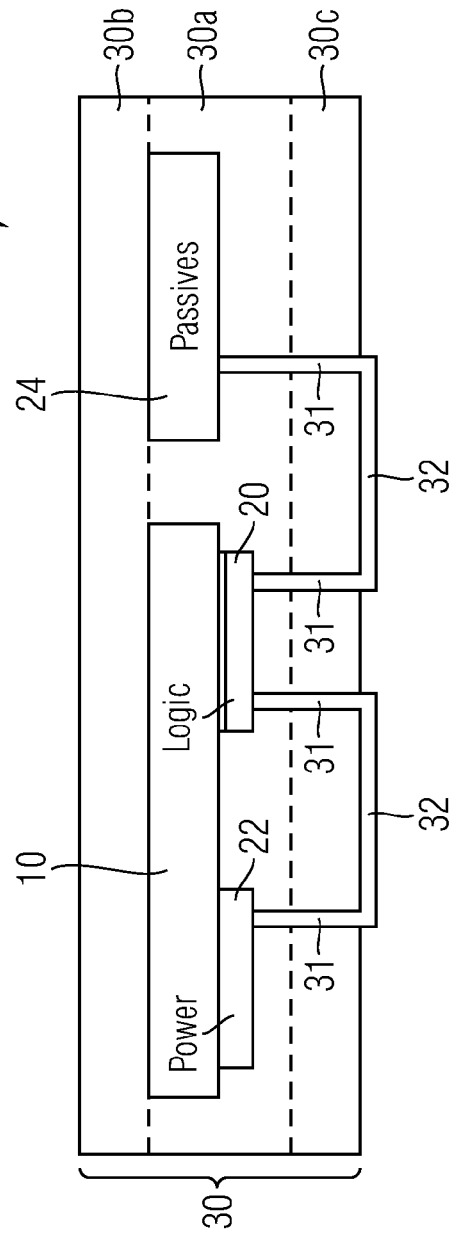
FIG. 1B schematically illustrates a cross-sectional view of one embodiment of a chip package comprising a chip carrier, a logic chip, a power chip, a passive component, and an insulating laminate structure.

In another embodiment as shown in FIG. 1B, the insulating laminate structure 30 may comprise a second electrically insulating layer 30b which may be laminated onto the top side of the chip carrier 10. The second electrically insulating layer 30b may partly or completely cover the top side of the chip carrier 10.

Furthermore, as illustrated in FIG. 1B, the laminate structure 30 may comprise a third electrically insulating layer 30c which may be laminated onto the bottom side of the electrically insulating layer 30a. In the implementation of chip package 100B, the first structured electrically conducting layer 32 is applied on the bottom side of the third electrically insulating layer 30c. The through-connections 31 coupling the first structured electrically layer and, e.g., the power chip 22, the logic chip 20, or the passive component 24 may extend vertically through the electrically insulating layers 30a and 30b.

In one embodiment, a second structured electrically conducting layer (not shown) may be applied to the top side of the insulating laminate structure 30, i.e. the top side of the second electrically insulating layer 30b. The second structured electrically conducting layer may be configured as external terminals of the chip package 100B coupled to the components of the chip package 100B and configured to be coupled to external circuitry such as, e.g., an application board.

In another embodiment, a third structured electrically conducting layer (not shown) may be applied between the first electrically insulating layer 30a and the second electrically insulating layer 30b of the insulating laminate structure 30. The third structured electrically conducting layer may, optionally, be used as a redistribution layer for providing a package-internal electrical interconnect similar as the first structured electrically insulating layer 32.

It is also possible that the passive component 24 may not be laminated between the first electrically insulating layer 30a and the second electrically insulating layer 30b of the insulating laminate structure 30 as shown in FIG. 1B, but between the first electrically insulating layer 30a and the third electrically insulating layer 30c.

Figure 2:
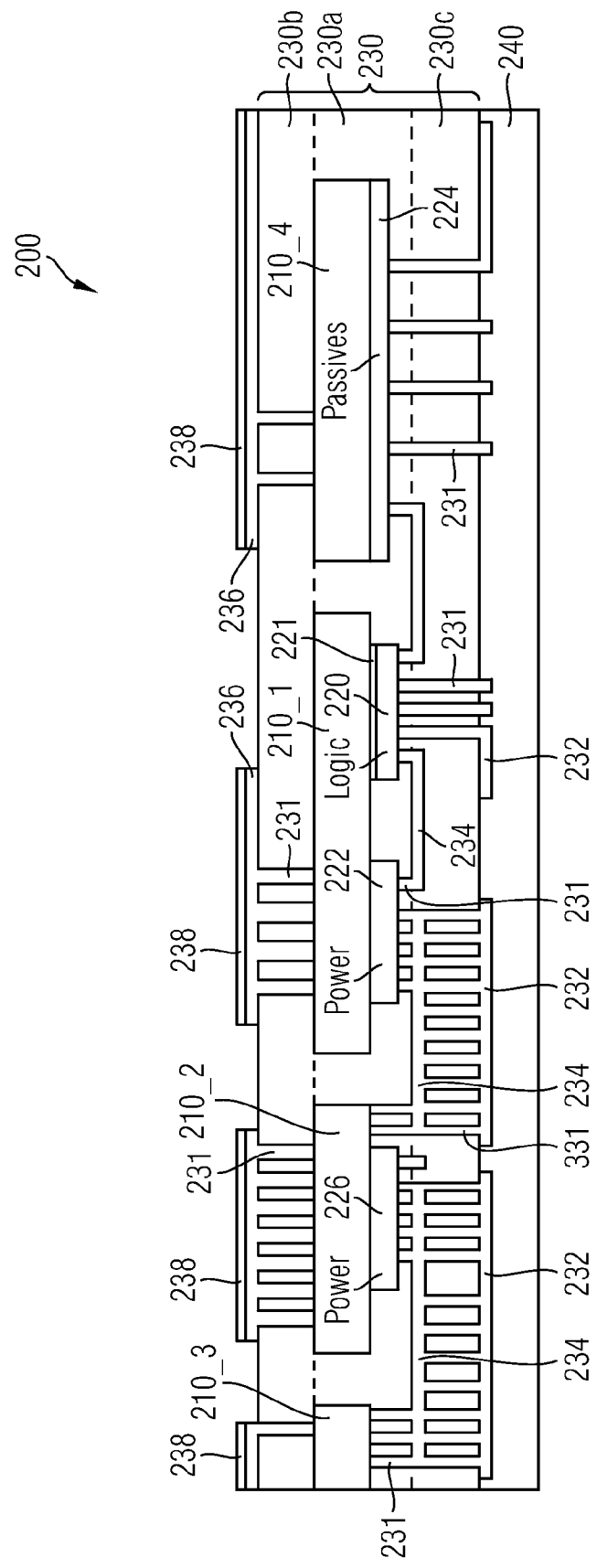
FIG. 2 illustrates a cross-sectional view of a chip package with a passive component mounted on a leadframe.

FIG. 2 illustrates an exemplary implementation of a chip package 200. Without saying, the techniques, layers, materials and methods described above may also be applied to the implementation explained further below in FIG. 2.

The chip package 200 may comprise a chip carrier which is, without loss of generality, exemplified in the following by e.g. a leadframe 210. The leadframe 210 (i.e. chip carrier) may have a thickness in the range between 100 μm and 500 μm and more particularly around 250 μm. The leadframe 210 may include a first part 210_1, a second part 210_2, a third part 210_3 and a fourth part 210_4 which are separated from one another. The leadframe 210 may be electrically conducting and, for example, be made of copper.

The chip package 200 may be a multichip package comprising at least two chips, e.g. one logic chip and one power chip. By way of example, as shown in FIG. 2, the chip package 200 may further comprise a logic chip 220, a first power chip 222, and, e.g., a second power chip 226. The chips 220, 222 and 226 may be mounted onto the bottom side of the leadframe 210. In another implementations the chips 220, 222 and 226 may be mounted onto the top side of the leadframe 210 or may be mounted onto different sides of the leadframe 210. As shown in FIG. 2, the logic chip 220 and the power chip 222 may be mounted onto the bottom side of the first part 210_1 of the leadframe 210 and the power chip 226 may be mounted on the bottom side of the second part 210_2 of the leadframe 210.

As described before, the logic chip 220 may have a non-vertical chip structure comprising an active main surface including e.g. contact pads of the semiconductor chip and a passive main surface having no contact pads. The passive main surface of the logic chip 220 may be electrically insulated from the electrically conducting leadframe 210 by an electrically insulating layer 221. For instance, the electrically insulating layer 221 may be, e.g., an electrically insulating adhesive. In one implementation, the electrically insulating layer 221 may be integrated to the logic chip 221 as a part of the chip structure, e.g. as a hard passivation layer such as, e.g., an oxide or nitride layer.

Furthermore, the first and second power chips 222 and 226 may have, e.g., a vertical chip structure. Thus, by way of example, the drain electrode pads (not shown in the FIG. 2) of the power chips 222 and 226 may be mechanically mounted and electrically coupled to the leadframe parts 210_1 and 210_2, respectively. The opposite main surfaces of the power chips 222 and 226, which face away from the leadframe 210, may provide contact pads for the source electrode (not shown) and the gate electrode (not shown). For instance, the source electrode of the first power chip 222 may be coupled to the second part 210_2 and the source electrode of the second power chip 226 may be coupled to the third part 210_3 of the leadframe 210. The gate electrode of the first power chip 222 may be coupled to a contact pad of the logic chip 220. And the gate electrode of the second power chip 226 may be coupled to logic chip 220, which is, however, not shown in FIG. 2, since the connecting trace may be out of the plane of the cross-section view.

The chip package 200 may further comprise a passive component 224. The passive component 224 may be mounted onto the bottom side of the fourth part 210_4 of the leadframe 210. In another implementation, the passive component 224 may be mounted onto the top side of the fourth part 210_4 of the chip carrier 210, or the passive component 224 may be mounted onto another part of the leadframe 210. In one implementation, the top side of the passive component 224 may have at least one contact pad (not shown) electrically coupled to the at least one passive device of the passive component 224. As shown in FIG. 2, the top side of the passive component 224 may be mechanically mounted and directly coupled to the fourth part 210_4 of the leadframe 210. In another implementation the top side of the passive component 224 may have no contact pads on this surface. The bottom side of the passive component 224, as shown in the implementation of FIG. 2, may have a plurality of, e.g., five contact pads, which are indirectly shown by through-connections 231 connected to the contact pads.

The chip package 200 may further comprise an insulating laminate structure 230. The insulating laminate structure 230 may embed the leadframe 210, the logic chip 220, the first power chip 222, the second power chip 226 and the passive component 224 in the same way and to the same extent as described above with respect to FIGS. 1A and 1B. That is, in one embodiment, the insulating laminate structure 230 may comprise a first electrically insulating layer 230a mounted on the bottom side of the leadframe 210 with the logic chip 220, the first power chip 222, the second power chip 226, and the passive component 224 mounted thereon, an optional second electrically insulating layer 230b mounted on the top side of the leadframe 210, and an optional third electrically insulating layer 230c attached to the bottom side of the of the first electrically insulating layer 230a. The thickness of the first electrically insulating layer 230a may be between 50 μm and 500 μm and, more particularly, around 100 μm. The thickness of the second electrically insulating layer 230b may be between 20 μm and 100 μm and, more particularly, around 45 μm. The thickness of the third electrically insulating layer 230c may be between 20 μm and 200 μm and, more particularly, around 50 μm.

The second electrically insulating layer 230b can be omitted. In this case, which corresponds to the implementation of the chip package 100A of FIG. 1A, the top sides of one or more of the parts 210_1, 210_2, 210_3 and/or 210_4 of the leadframe 210 may remain exposed and could itself be used as external terminals configured to be mounted on a heat sink or on an application board.

Furthermore, the chip package 200 may, e.g., comprise a first structured electrically conducting layer 232, a second structured electrically conducting layer 236, and a third structured electrically conducting layer 234. The third structured electrically conducting layer 234 may be embedded between two electrically insulating layers of the insulating laminate structure 230, e.g., between layers 230a and 230c. The first structured electrically conducting layer 232 may be applied to the bottom side surface of the insulating laminate structure 230. The second structured electrically conducting layer 236 may be applied to the top side surface of the insulating laminate structure 230.

The first structured electrically conducting layer 232 and the third structured electrically conducting layer 234 may serve as an electrical redistribution structure providing interconnections between electrode pads of the logic chip 220, the power chips 222 and 226, the passive component 224 and/or the parts 210_1, 210_2, 210_3, 210_4 of the leadframe 210. The third structured electrically conducting layer 234 is optional and may be omitted in case it is not needed. The thickness of the first and third electrically conducting layers 232 and 234 may be between 5 μm and 100 μm and more particularly around 40 μm.

As illustrated in FIG. 2 the second structured electrically conducting layer 236 may be configured as external contact pads (i.e. external terminals) of the chip package 200. The second structured electrically conducting layer 236 may e.g. comprise a first external contact pad electrically coupled to the first part 210_1 of the leadframe, a second external contact pad electrically coupled to the second part 210_2, a third external contact pad electrically coupled to the third part 210_3, and a fourth external contact pad electrically coupled to the fourth part 210_4. The second structured electrically conducting layer 236 may optionally be reinforced by an additional layer 238 mounted on top of the layer 236. The layer 238 may be a metal layer, such as a copper layer, for e.g. soldering of the external contact pads to an application board. That is, the second structured electrically conducting layer 236 with the optionally reinforcement layer 238 may define the footprint of the chip package 200. The thickness of the second structured electrically conducting layer 236 with the optional reinforcement layer 238 may be between 5 µm and 100 µm and more particularly around 50 µm.

The insulating laminate structure 230 of the chip package 200 may comprise at least one via or through-connection 231. The at least one through-connection 231 may provide an electrical connection through one or more electrically insulating layers of the insulating laminate structure 230, e.g. through layers 230a, 230b, and/or 230c. By way of example, the bottom side of the leadframe 210 and/or contact pads of the semiconductor chips 220, 222, 226 and the passive component 224 may be electrically coupled by through-connections 231 to the third structured electrically conducting layer 234 or to the first structured electrically conducting layer 232. The first structured electrically conducting layer 232 may be electrically coupled to the third structured electrically conducting layer 234 by through-connections 231. The second structured electrically conducting layer 236 may, e.g., be electrically coupled to the top side of the leadframe 210 by through-connections 231.

The chip package 200 shown in FIG. 2 may optionally comprise an electrically insulating layer 240 applied to the bottom side of the insulating laminate structure 230 with the first structured electrically conducting layer 232 thereon. For instance, the electrical insulating layer 240 may be applied by a laminate method, or by any other appropriate method. The electrical insulating layer 240 may partly or completely cover the first structured electrically conducting layer 232. The electrical insulating layer 240 may serve as a protection layer in order to prevent possible damage of the bottom side of the chip package 200 by environmental attack, e.g., by mechanical, chemical or other type of impact.

Figure 3:
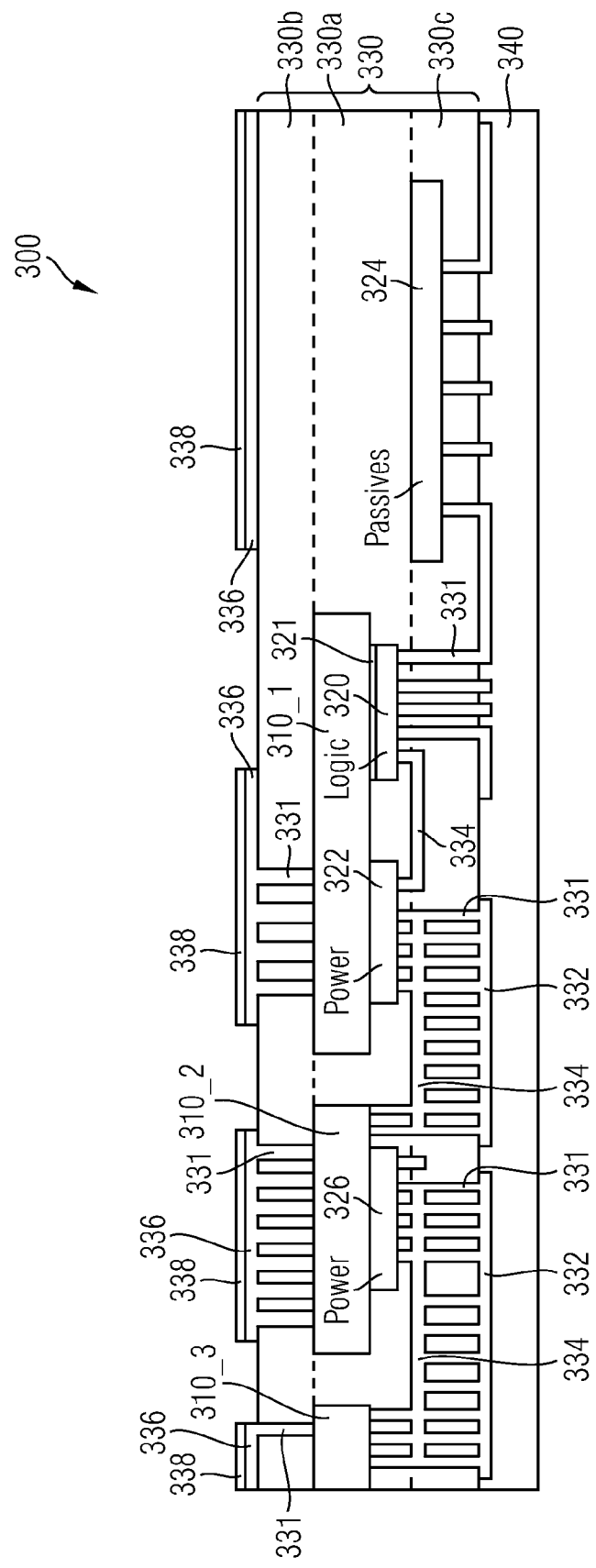
FIG. 3 illustrates a cross-sectional view of a chip package with a passive component embedded between two electrically insulating layers.

In FIG. 3 an implementation of a chip package 300 is shown. The implementation of the chip package 300 in FIG. 3 is the same as the implementation of the chip package 200 in FIG. 2, except that the passive component 324 is not mounted onto the leadframe 310. Further, the leadframe 310 may e.g. comprise only three parts, a first part 310_1, a second part 310_2, and a third part 310_3.

As shown in FIG. 3, the passive component 324 may be embedded between the first electrically insulating layer 330a and the third electrically insulating layer 330c of the insulating laminate structure 330 by a lamination technique. In another implementation, the passive component 324 may be embedded at the top side of the first electrically insulating layer 330a by a lamination technique, similar to the implementation of the chip package 100A of FIG. 1A, with or without a second electrically insulating layer 230b being applied on the top side of the first electrically insulating layer 330a. In this implementation the third electrically insulating layer 330c can be omitted in case it is not needed.

The passive component 324 of the chip package 300 may have a bottom side which may have contact pads coupled to the at least one passive device of the passive component 324. As shown by through-connections 331 attached to the bottom side of the passive component 324, the passive component 324 may comprise a plurality of e.g. at least five contact pads. The top side of the passive component may have no contact pads. In other implementations the top side of the passive component 324 may include contact pads.

Figure 4:
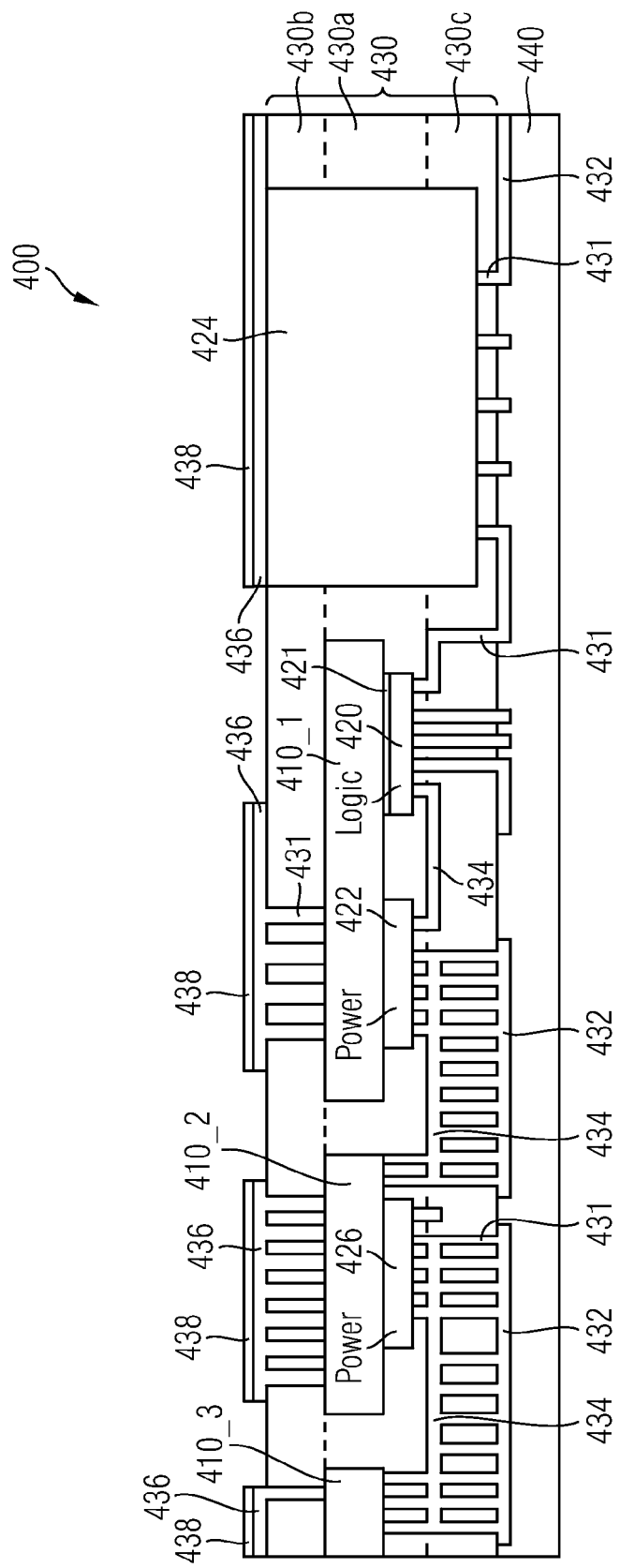
FIG. 4 illustrates a cross-sectional view of a chip package with a passive component extending to the top side of the chip package.

FIG. 4 illustrates an implementation of an exemplary chip package 400 which is the same or similar as the implementation of the chip package 300 in FIG. 3, except that the topside of the passive component 424 has at least one contact pad which is directly connected to or itself configured as an external terminal of the chip package 400. The top side of the passive component 424 may remain uncovered by any electrically insulating layer of the insulating laminate structure 430.

In the implementation of chip package 400, the chip package 424 may be inserted into the insulating laminate structure 430 including a first electrically insulating layer 430a, a second electrically insulating layer 430b, and third electrically insulating layer 430c after the insulating laminate structure 430 is applied to the chip package 400. This may be carried out by forming an opening in the top side of the insulating laminate structure 430 before insertion of the chip package 424 by, e.g., conventional drilling, laser drilling, etching, punching, or by any other appropriate method. The opening may be formed after lamination or before lamination (i.e. may be a pre-formed opening). The opening may be formed at a section of the top side of the insulating laminate structure 430 which is, in a vertical projection, laterally outside the outline of a part of the leadframe 410. At least one or all lateral dimensions of the opening may correspond to at least one or all lateral dimensions of the chip package 424. The depth of the opening may be at least the thickness of the second electrically insulating layer 430b and may extend through the first electrically insulating layer 430a into the third electrically insulating layer 430c. The passive component 424 may be inserted into the opening in away that the top side with the contact pads configured e.g. as external terminal is in the same plane as the top side of the insulating laminate structure 430. Optionally, a second structured electrically conducting layer 436 and a reinforcement layer 438 on top of layer 436 may overlay and couple to the external terminal of the passive component 424. As mentioned above the second structured electrically conducting layer 436 with the reinforcement layer 438 on top may define the footprint of the chip package 400. The passive component 424 may directly be coupled to or may be apart of the footprint of the chip package 400.

In another implementation, the passive component 424 may be inserted into the insulating laminate structure 430 from the bottom side of the insulating laminate structure 430, i.e. from the bottom side of the third electrically insulating layer 430c or from the bottom side of the first electrically insulating layer 430a, in a similar way as mentioned above. In this case an external terminal of the passive component 424 may be connected via a redistribution structure and/or a through-connection to the second structured electrically conducting layer 436 in order to be coupled to the footprint of the chip package 400.

Figure 5:
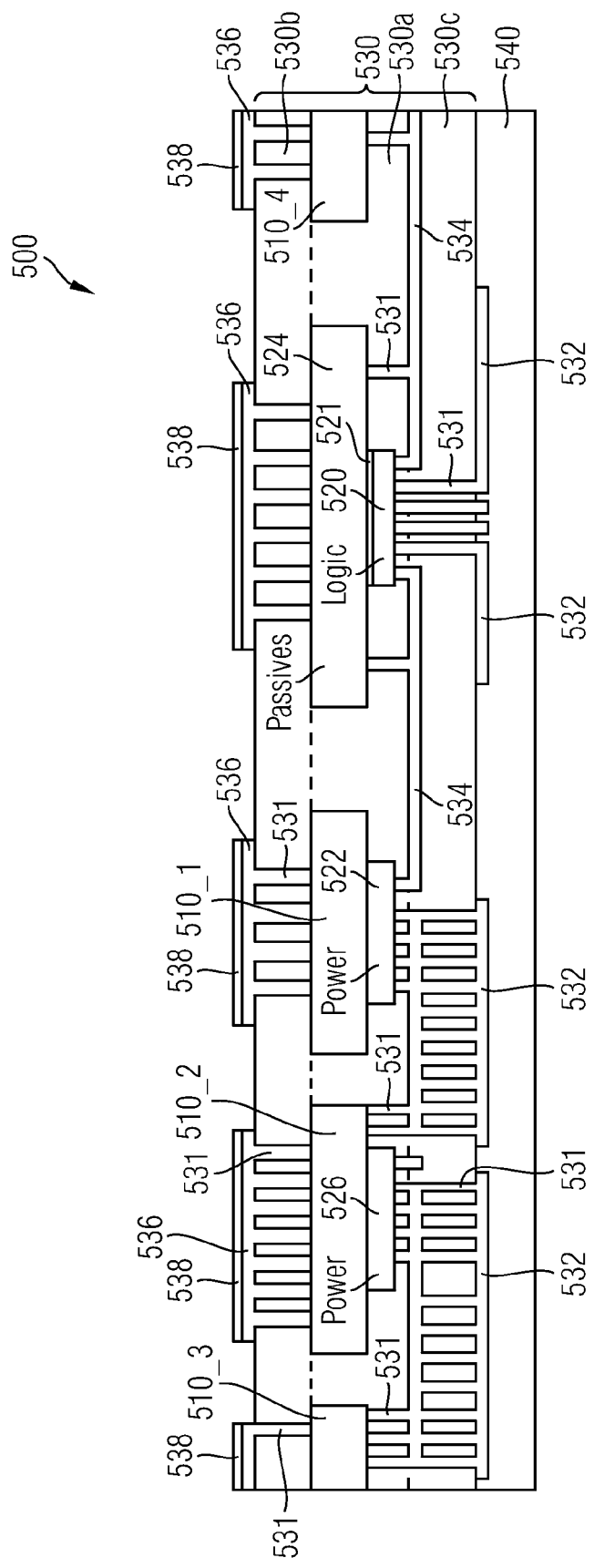
FIG. 5 illustrates a cross-sectional view of a chip package with a stack of a passive component and a semiconductor chip.

FIG. 5 illustrates an implementation of an exemplary chip package 500. Without saying, the techniques, layers, materials and methods described above may also be applied to the implementation explained further below in FIG. 5.

The chip package 500 may comprise an electrically conducting leadframe 510 having a plurality of separate parts, e.g., a first part 510_1, a second part 510_2, a third part 510_3, and fourth part 510_4. The leadframe may be made, e.g., of copper. Further, the leadframe 510 may have a thickness in the range between 100 µm and 500 µm and more particularly around 250 µm.

The chip package 500 may comprise a passive component 524, which may be positioned in or passes through the plane defined by the leadframe 510, e.g. defined by the lower or upper surface thereof. The passive component 524 may be separated from the leadframe 510. The passive component 524 may have contact pads on its top side and/or on its bottom side. As mentioned above, contact pads are indicated indirectly by through-connections 531 attached to the corresponding contact pads.

Furthermore, the passive component 524 may be configured to serve as a carrier for a semiconductor chip. As shown in the implementation in FIG. 5, a section of the bottom side of the passive package 524 may be used to mount a semiconductor chip onto it. The bottom side surface and/or the top side surface of the passive component 524 may be coplanar with the bottom and/or top surface of the leadframe, respectively. The semiconductor chip may be mounted onto the bottom side of the passive component 524 and may form a stacked device, i.e. a stack of the passive component 524 and the semiconductor chip. In another implementation, the semiconductor chip may be mounted onto the top side of the passive component 524. Again in another implementation, the stack of the passive component 524 and semiconductor chip may be produced during the packaging process, e.g., when the semiconductor chips are mounted onto the leadframe. In another embodiment, the stack of the passive component 524 and the semiconductor chip may be pre-manufactured and laminated into the chip package 500 as a whole.

The semiconductor chip mounted to the bottom side of the passive component 524 in the chip package 500 may e.g. be a logic chip 520. The logic chip 520 may be mounted with its passive surface, which is the top side of the logic chip 520, directed on the bottom side of the passive component 524. Between the passive component 524 and the logic chip 520 an electrically insulating layer 521 may be applied. As mentioned above the electrically insulating layer 521 may be, e.g., an electrically insulating adhesive for attaching the chip 520 to the passive component 524. In another implementation the electrically insulating layer 521 may constitute a part of the logic chip 520 and the logic chip 520 can be mounted onto the passive component 524 by any appropriate method. The active surface of the logic chip 520 may be the bottom side of the logic chip 520. As shown in FIG. 5, the logic chip 510 may comprise, e.g., six contact pads which are indirectly shown by the through-connections 531 being attached to the logic chip 520. One or more, e.g. two of the contact pads may be coupled to the contact pads at the bottom side of the passive component 524.

The chip package 500 may further comprise a first power chip 522 and a second power chip 526. The first power chip 522 may be attached to the first part 510_1 of the leadframe 510. The second power chip 526 may be attached to the second part 510_2 of the leadframe 510. The power chips 522 and 526 may have a vertical structure. The drain electrode of the power chip, which may be at the top side of the power chips 522 and 526, may be mechanically mounted and electrically coupled to the leadframe 510. The opposite surfaces of the power chips 522 and 526, which face away from the leadframe 510, may provide contact pads for the source electrode (not shown) and the gate electrode (not shown) of the power chip.

The chip package 500 further comprises an insulating laminate structure 530. The insulating laminate structure 530 may embed the leadframe 510 with the power chips 522 and 526 mounted thereon and the passive component 524 with the logic chip 520 mounted thereon in the same way and to the same extent as described above in conjunction with FIGS. 1A, 1B and 2. That is, in one embodiment, the insulating laminate structure 530 may comprise a first electrically insulating layer 530a applied onto the bottom side of the leadframe 510 with the power chips 522 and 526 mounted thereon and the bottom side of the passive component 524 with the logic chip 520 mounted thereon. The insulating laminate structure 530 may further comprise optionally a second electrically insulating layer 530b mounted on the top side of the leadframe 510 and the passive component 524 and, optionally, a third electrically insulating layer 530c attached to the bottom side of the first electrically insulating layer 530a. The thickness of the first electrically insulating layer 530a may be between 50 µm and 500 µm and more particularly around 100 µm. The thickness of the second electrically insulating layer 530b may be between 20 µm and 100 µm and more particularly around 45 µm. The thickness of the third electrically insulating layer 530c may be between 20 µm and 200 µm and more particularly around 50 µm.

The second electrically insulating layer 530b can be omitted. In this case, the top sides of one or more of the parts 510_1, 510_2, 510_3 and/or 510_4 of the leadframe 510 may remain exposed and could itself be used as external terminals configured to be mounted on a heat sink or on an application board.

Furthermore, the chip package 500 may comprise the following components: a first structured electrically conducting layer 532; a second structured electrically conducting layer 536; a third structured electrically conducting layer 534; a reinforcement layer 538; at least one through-connections 531; and a protective electrically insulating layer 540. The features and arrangements of these components of the chip package 500, which are also included in the chip package 200, may be identical or similar as for the chip package 200. Therefore, in order to avoid reiteration, reference is made to the description of chip package 200 in view of these components. One difference to the chip package 200 is that the second structured electrically conducting layer 536 additionally comprises a fifth external contact pad (external terminal) being electrically coupled to the passive component 524.

Figure 6:
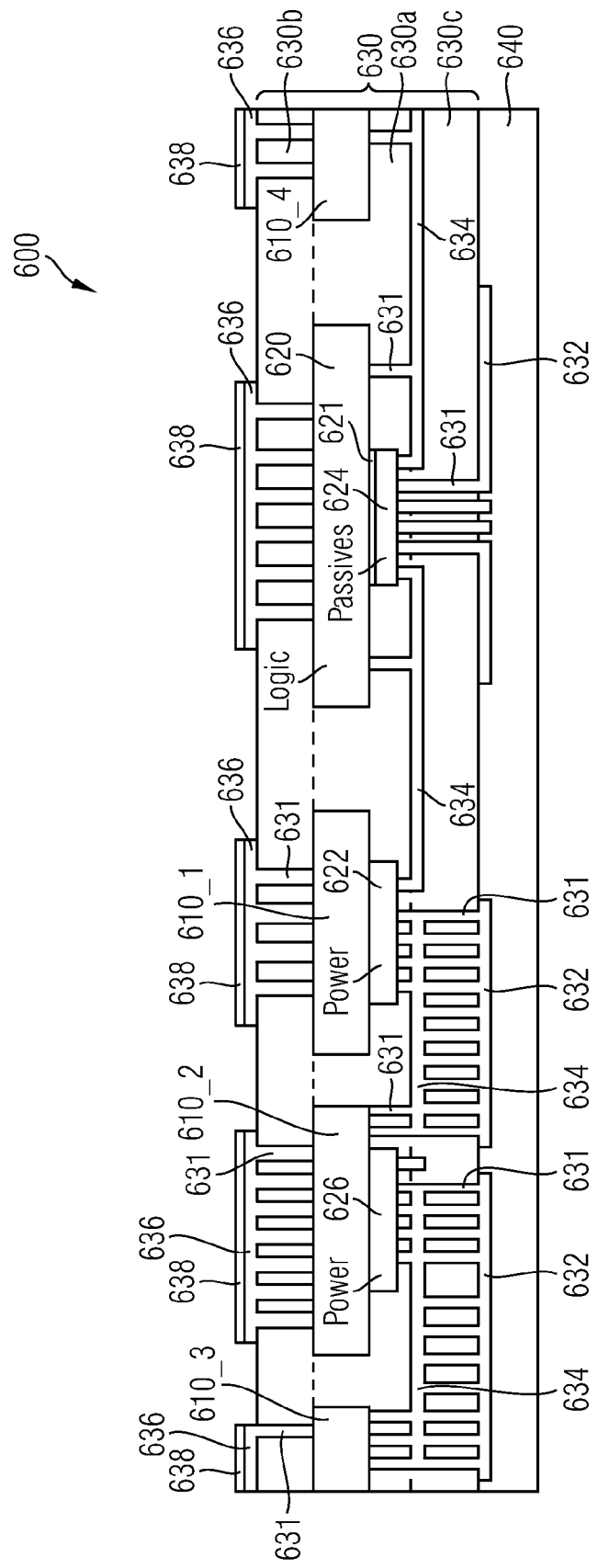
FIG. 6 illustrates a cross-sectional view of a chip package with a stack of a passive component and a semiconductor chip.

FIG. 6 shows an exemplary chip package 600. The implementation of the chip package 600 is the same or similar as the implementation of the chip package 500 in FIG. 5, except that instead of the passive component 524 the logic chip 620 may be positioned in or passes through the plane defined by the leadframe 610 (e.g. by the lower or upper surface thereof) and may be configured to serve as a carrier for the passive component 624. In order to avoid reiteration, reference is made to the description of chip package 200 and particularly of chip package 500 in view of the features and arrangements of the components of chip package 600 except where it is indicated otherwise.

In the implementation of the chip package 600, the passive component 624 may be mounted onto the bottom side of the logic chip 620. Furthermore, the logic chip 620 may have e.g. a top side being the active surface and a bottom side having, e.g., additional contact pads (e.g. generated by TSV (through-silicon vias). A section of the bottom side, where the passive component 624 may be mounted, may have no contact pads.

Optionally, an electrically insulating layer 621 may be applied between the logic chip 620 and the passive component 624.

Figure 7:
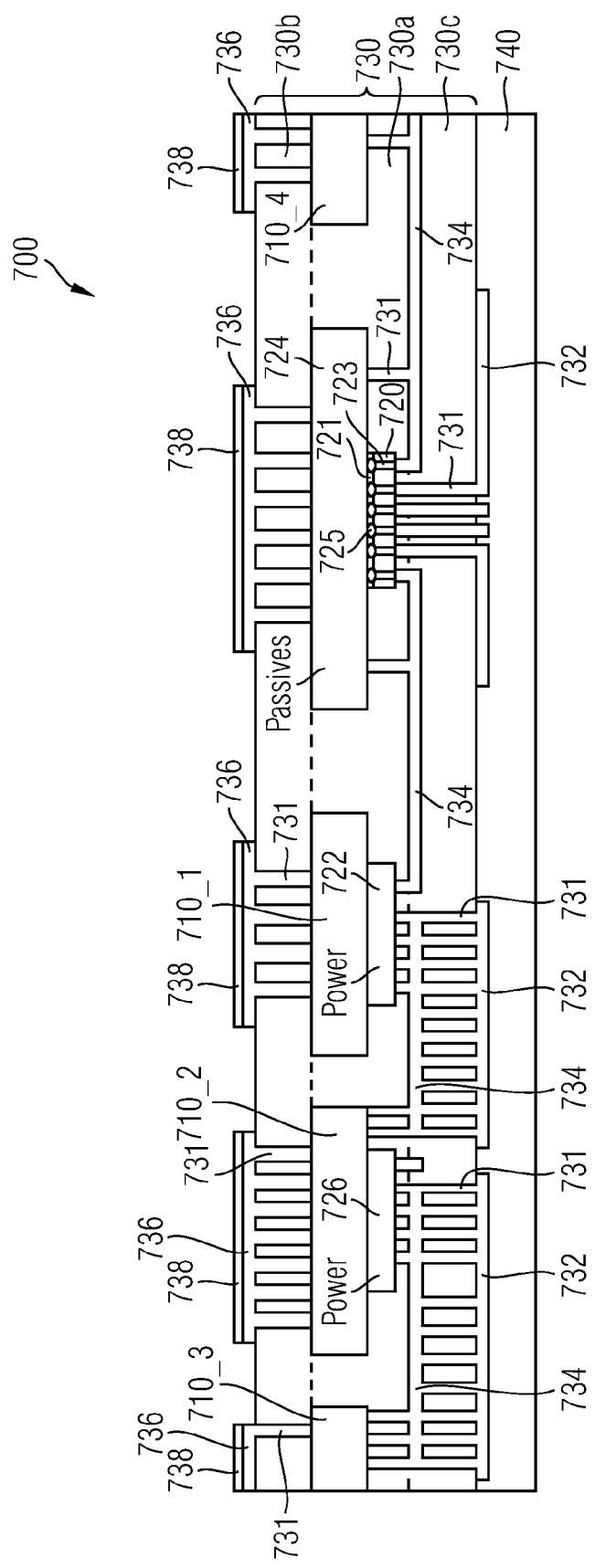
FIG. 7 illustrates a cross-sectional view of a chip package with a stack of a passive component and a semiconductor chip.

FIG. 7 shows an exemplary chip package 700. The implementation of the chip package 700 is the same or similar as the implementation of the chip package 500 in FIG. 5, except that the logic chip 720 may have through-vias 723, e.g. TSVs, electrically coupling the bottom side of the logic chip 720 to contact pads at its top side which, itself, are coupled to contact pads at the bottom side of the passive component 724. In order to avoid reiteration, reference is made to the description of chip package 200 and particularly of chip package 500 in view of the features and arrangements of the components of chip package 700 except where it is indicated otherwise.

The logic chip 720 may have a top side being a passive surface and a bottom side which may be an active surface having contact pads (not shown) coupled to the integrated circuits of the logic chip 720. At least one through-via or through-silicon-via (TSV) 723 of the logic chip 720 may connect to at least at one contact pad at the top side of the logic chip 720.

In one embodiment, the logic chip 720 may be attached to the passive component 724 by a bond layer made of solder as mentioned above. At least one solder ball 725 may be applied to the at least one contact pad at the top side of the logic chip 720 for mechanically attaching and electrically coupling the logic chip 720 to the bottom side of the passive component 724. Furthermore, the top side of the logic chip 720 may comprise an array of solder balls 725. The array of solder balls 725 may be coupled to a corresponding array of contact pads of the passive component 724.

Furthermore, it is also possible that the logic chip 720 is mounted on the passive component 724 in a flip-chip orientation. In this case, the active surface of the logic chip 720 faces the bottom surface of the passive component 724. TSVs may e.g. be omitted. In both cases (regular and flip-chip mounting), an electrically insulating layer 723 (e.g. a so-called underfill layer) may optionally be applied between the logic chip 720 and the passive component 724 after the logic chip 720 is attached by the solder balls 725 to the passive component 724.

Any other appropriate method may be used to mechanically attach and electrically couple the contact pads at the top side of the logic chip 720 to the contact pads at the bottom side of the passive component 724. For instance, electrically conducting adhesives as mentioned above may be used.

In one implementation, the stacking of the passive component 724 and the logic chip 720 may be carried out during the packaging process, e.g., when the power chips 722 and 726 may be mounted onto the leadframe 710. However, in another implementation, the stacking of the passive component 724 and the logic chip 720 may be carried out in advance and the pre-fabricated stacked device may be embedded in the chip package 700 as a whole.

Figure 8:
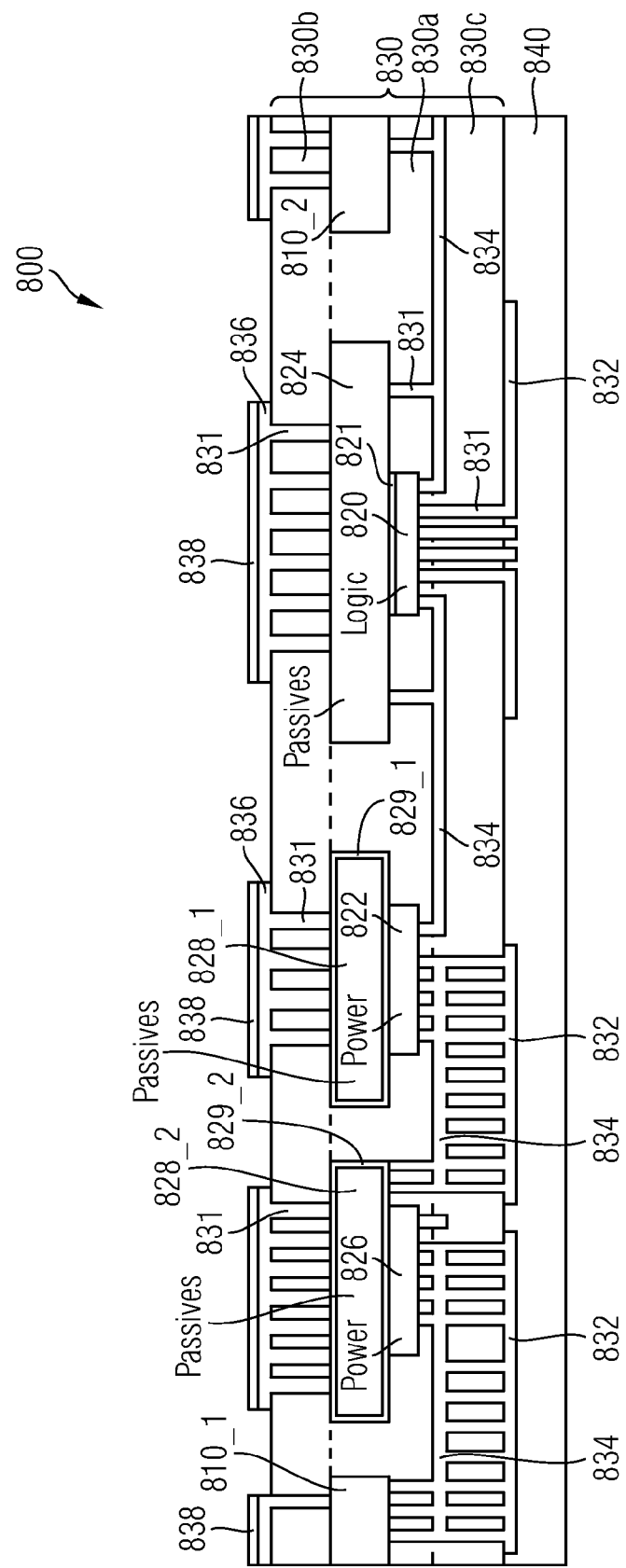
FIG. 8 illustrates a cross-sectional view of a chip package with a stack of a passive component with a metal layer on its surface and a semiconductor chip.

FIG. 8 shows an implementation of an exemplary chip package 800. The implementation of the chip package 800 is the same as the implementation of the chip package 500 in FIG. 5, except that the power chips 822 and 826 are also mounted on passive component 828_1 and 828_2, wherein the surface of the passive components 828_1 and 828_2 may at least partially or completely be coated by metal layers 829_1 and 829_2, respectively. In order to avoid reiteration, reference is made to the description of chip package 200 and particularly of chip package 500 in view of the features and arrangements of the components of chip package 800 except where it is indicated otherwise.

As shown in FIG. 8, the first part 810_1 and the second part 810_2 of the leadframe 810 of chip package 800 correspond to the third part 510_3 and fourth part 510_4 of the leadframe 510 of chip package 500. Further, the first part 510_1 and second part 510_2 of the lead frame 510 of chip package 500 are replaced in the implementation of FIG. 8 by the passive components 828_1 and 828_2.

The metal layers 829_1 and 829_2 may partly or completely cover at least one side wall and/or at least one or both main surfaces of the passive components 828_1 and 828_2. By way of example, an outline of the semiconductor chip 822 may define a surface zone on the bottom surface of the passive component 828_1, wherein the metal layer 829_1 covers e.g. equal to or more than 50%, 80%, or 100% of the surface zone or of the overall bottom surface of the passive component 828_1. The metal layers 829_1 and 829_2 may serve as electrical contacts, e.g. drain contacts, of the semiconductor power chips 822, 826, respectively, and as thermal conductors for dissipating heat generated in the power semiconductor chips 822, 826 to the external contact pads 836 of the chip package 800. In the implementation of chip package 800, the metal layers 829_1 and 829_2 may e.g. be coated completely on all sides/surfaces of the passive components 828_1 or 828_2 to provide for minimum electrical resistance and maximum heat transfer capability. In this implementation, the arrangement and features of other components of the chip package 800, such as the through-connections 831 or the first and third structured electrically conducting layers 832 and 834, may be similar to the implementation of chip package 500. In another implementation, the metal layers 829_1 or 829_2 may be structured layers providing electrical and thermal traces extending from the bottom surfaces of the passive components 828_1 and 828_2 to their top surfaces. By way of example, the metal layers 829_1 and 829_2 may be made of copper.

The power chip 822 may be mechanically mounted and electrically coupled to the metal layer 829_1 at the bottom side of passive component 828_1. In the same way, the power chip 826 may be mechanically mounted and electrically coupled to the metal layer 829_2 at the bottom side of the passive component 828_2. The power chips 822 and 826 may be attached to the passive components 828_1 and 828_2 in the same way as, e.g., the power chips 222 and 226 may be attached to the leadframe parts 210_1 and 210_2 in the implementation of chip package 200. In other words, the passive component 828_1 and/or 828_2 with the metal layer 829_1 and/or 829_2 coated on its surfaces may be used as chip carriers in replacement of e.g. a leadframe. The bottom side surfaces and/or the top side surfaces of the metal-coated passive component 828_1 and/or 828_2 and, e.g., the bottom side surface and/or the top side surface of the passive component 824 may be coplanar. In chip package 800, it is possible that the chip carrier (leadframe) is exclusively realized by passive components 828_1, 828_2 and 824. In this case, no leadframe is needed.

In one embodiment, the stack of the passive component 828_1 or 828_2 with the metal layer 829_1 or 829_2 coated on its surface and the power chip 822 or 826, respectively, thereon may be generated during the packaging process, e.g., before the first electrically insulating layer 830a of the insulating laminate structure 830 is applied. In another embodiment, the stacked devices of the passive component 828_1 or 828_2 with the metal layer 829_1 or 829_2 coated on its surface and the power chip 822 or 826, respectively, thereon may be pre-manufactured and embedded in the laminate structure 830 as a whole.

Figure 9:
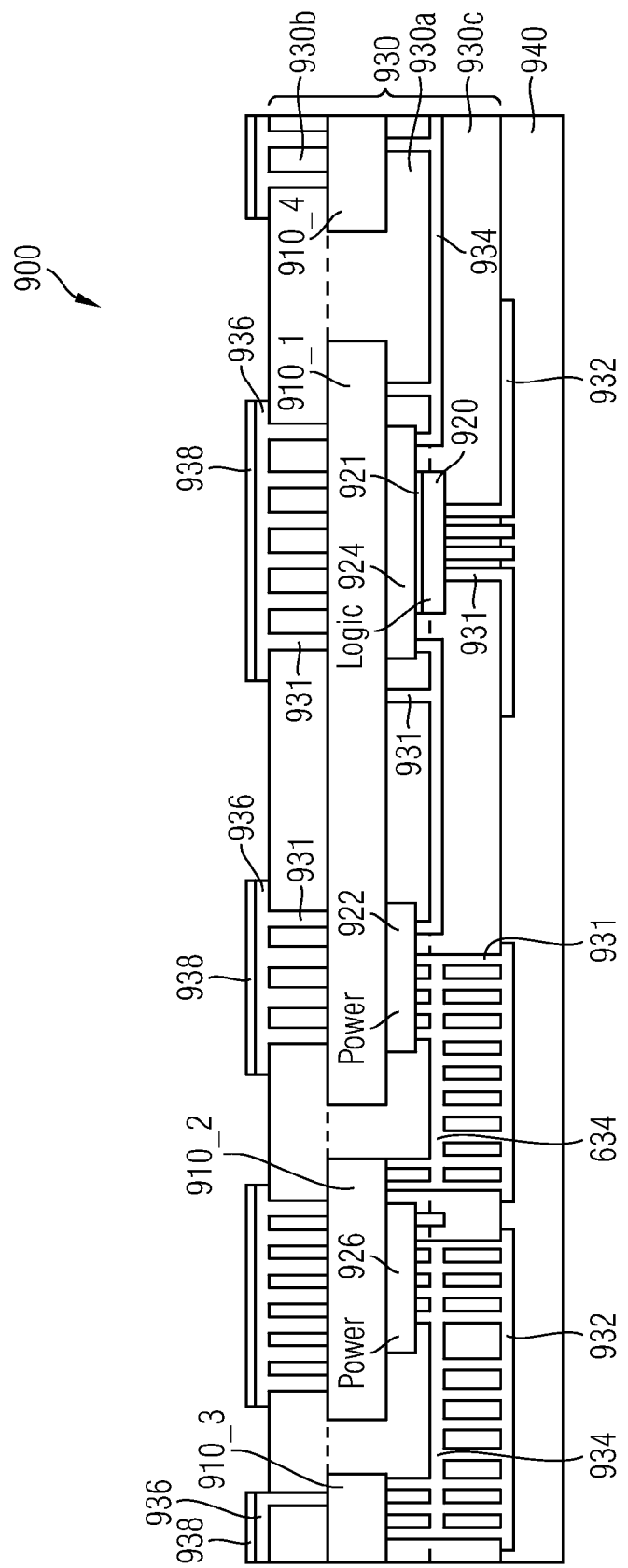
FIG. 9 illustrates a cross-sectional view of a chip package with a stack of a passive component and a semiconductor chip being mounted on a leadframe.

FIG. 9 shows an implementation of an exemplary chip package 900. The implementation of the chip package 900 is the same or similar as the implementation of the chip package 500 in FIG. 5, except that the stack of a passive component 924 and a logic chip 920 may be mounted on the first part 910_1 of the leadframe 910. In order to avoid reiteration, reference is made to the description of chip package 200 and particularly of chip package 500 in view of the features and arrangements of the components of chip package 900 except where it is indicated otherwise.

In one embodiment the top side of the passive component 924 may be mounted onto the bottom side of the first part 910_1 of the leadframe 910, wherein the passive component 924 is not electrically coupled to the leadframe 910. In another implementation, at least one contact pad of the top side of the passive component 924 may be electrically coupled to the leadframe 910. The passive component 924 may be attached to the first part 910_1 of the leadframe 910, e.g., via a bond layer or an adhesive paste as mentioned above. Afterwards, the top side of the logic chip 920 may be applied to the bottom side of the passive component 924 with an electrically insulating layer 921 applied in between. The top side of the logic chip 920 may be a passive side or e.g. the active side (e.g. when a flip chip mounting technique is used as described before).

The stack of the passive component 924 and the logic chip 920 may be pre-manufactured so that the stack may be mounted onto the bottom side of the first part 910_1 of the leadframe as a whole.

The stack of the passive component 924 and the semiconductor chip may in particular be similar as described for the implementation of chip package 700 in FIG. 7 or chip package 800 in FIG. 8. For example, the logic chip 920 may comprise through-vias, similar to the through-vias 723, coupled to the passive component 924, or a metal layer may be coated at least partially onto the passive component 924 similar to the metal layers 829_1 or 829_2. In a further implementation, the stack of the passive component 924 and a semiconductor chip may be electrically coupled to the first part 910_1 of leadframe 910.

The stack of the passive component 924 and the logic chip 920 may be mounted onto the first part 910_1 of the leadframe 910 on which another semiconductor chip, e.g. power semiconductor chip 922 is also mounted. Again, in another implementation, the stack of the passive component 924 and the logic chip 920 may be mounted onto a part of the leadframe 910 having no semiconductor chip attached as, e.g., onto the fourth part 910_4 of the leadframe 910.

In all implementations of the chip packages shown, the chip package may be configured as a half-bridge circuit. The half-bridge circuit may have at least one passive component including at least one passive device, such as an inductor, a capacitor, a resistor, or an IPD (integrated passive device), which is implemented in accordance with the description herein.

All chip packages shown in FIGS. 1 to 9 may be manufactured in similar processes. One exemplary process for manufacturing a chip package with a stack of a passive component and a semiconductor chip as e.g. shown in FIGS. 5 to 9 is illustrated in FIG. 10.

According to FIG. 10 a method for manufacturing a chip package with a stack of a passive component and a semiconductor chip may comprise, at S1, mounting a second semiconductor chip and a passive component on one another to provide for a stacked device. At S2, at least one first semiconductor chip is mounted onto an electrically conducting chip carrier. At S3, an electrically insulating layer is laminated over the electrically conducting chip carrier, the at least one first semiconductor chip, and the stacked device.

According to the different implementations of the chip packages, further processes may be added. For instance, before lamination at S3 is carried out, the stacked device may be mounted on the electrically conducting carrier. Further, before S3, the stacked device may be placed in a spaced apart relationship to the electrically conducting chip carrier.

Although specific implementations have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention may be limited only by the claims and the equivalents thereof.

What is claimed is:

1. A chip package, comprising:
an electrically conducting chip carrier;
at least one first semiconductor chip attached to the electrically conducting chip carrier;
a passive component; and
an insulating laminate structure embedding the electrically conducting chip carrier, the at least one first semiconductor chip, and the passive component,
wherein the passive component is arranged at a different level than the first semiconductor chip such that the passive component does not pass through any plane parallel to a main surface of the first semiconductor chip and intersecting the first semiconductor chip.

2. The chip package of claim 1, wherein the passive component comprises at least one passive device selected from the group consisting of a resistor, a capacitor, and an inductor.

3. The chip package of claim 1, wherein the passive component comprises at least one semiconductor chip configured as an integrated passive device.

4. The chip package of claim 1, wherein the passive component comprises a laminate housing.

5. The chip package of claim 1, wherein the insulating laminate structure comprises a first electrically insulating layer and a second electrically insulating layer, and wherein the passive component is mounted on the first electrically insulating layer and is embedded in the second electrically insulating layer.

6. The chip package of claim 1, wherein the passive component passes through a plane defined by the electrically conducting chip carrier.

7. The chip package of claim 1, wherein a contact pad of the passive component is coupled to a contact pad of the at least one first semiconductor chip.

8. The chip package of claim 1, wherein a contact pad of the passive component is configured as an external contact pad of the chip package.

9. The chip package of claim 1, wherein the at least one first semiconductor chip comprises a power chip or a logic chip.

10. The chip package of claim 1, further comprising a second semiconductor chip, wherein the second semiconductor chip and the passive component are mounted on one another.

11. The chip package of claim 10, wherein the second semiconductor chip comprises an active surface and a passive surface, and wherein the passive surface of the second semiconductor chip is mounted to the passive component.

12. The chip package of claim 10, wherein at least one electrical contact pad of the second semiconductor chip is bonded to a contact pad of the passive component.

13. The chip package of claim 10, wherein the second semiconductor chip comprises electrical contact elements arranged on a passive surface of the second semiconductor chip and through-vias passing through the second semiconductor chip and electrically connecting to the electrical contact elements on the passive surface.

14. The chip package of claim 10, wherein the second semiconductor chip is a logic chip.

15. The chip package of claim 14, wherein the at least one first semiconductor chip is a power chip.

16. The chip package of claim 10, wherein the passive component passes through a plane defined by the electrically conducting chip carrier.

17. The chip package of claim 10, wherein the second semiconductor chip passes through a plane defined by the electrically conducting chip carrier.

18. The chip package of claim 10, wherein the passive component is mounted on the electrically conducting chip carrier and the second semiconductor chip is mounted on the passive component.

19. A chip package, comprising:
an electrically conducting chip carrier;
at least one first semiconductor chip attached to the electrically conducting chip carrier;
a passive component;
an insulating laminate structure embedding the electrically conducting chip carrier, the at least one first semiconductor chip, and the passive component; and
a second semiconductor chip,
wherein the second semiconductor chip and the passive component are mounted on one another.

* * * * *